(12) United States Patent
Ianovitch

(10) Patent No.: US 6,303,477 B1
(45) Date of Patent: Oct. 16, 2001

(54) REMOVAL OF ORGANIC ANTI-REFLECTION COATINGS IN INTEGRATED CIRCUITS

(75) Inventor: Serguei Ianovitch, Singapore (SG)

(73) Assignees: Chartered Semiconductor Manufacturing LTD, Singapore (SG); Lucent Technologies, Inc., Allentown, PA (US)

( * ) Notice: Subject to any disclaimer, the term of this patent is extended or adjusted under 35 U.S.C. 154(b) by 0 days.

(21) Appl. No.: 09/826,489

(22) Filed: Apr. 4, 2001

(51) Int. Cl.$^7$ .................................................. H01L 21/38
(52) U.S. Cl. ........................................ 438/551; 438/710
(58) Field of Search .................................... 438/704, 706, 438/707, 708, 709, 710, 711, 712, 551

(56) References Cited

U.S. PATENT DOCUMENTS

| | | | |
|---|---|---|---|
| 5,401,614 | 3/1995 | Dichiara et al. | 430/323 |
| 5,767,018 | 6/1998 | Bell | 438/696 |
| 5,865,900 | * 2/1999 | Lee et al. | 134/12 |
| 5,880,019 | 3/1999 | Hsieh et al. | 438/701 |
| 5,885,902 | 3/1999 | Blasingame et al. | 438/738 |
| 5,892,248 | 4/1999 | Oki et al. | 257/197 |
| 5,910,453 | 6/1999 | Gupta et al. | 438/717 |
| 5,981,398 | * 11/1999 | Tsai et al. | 438/710 |
| 6,127,262 | * 10/2000 | Huang et al. | 438/634 |

* cited by examiner

*Primary Examiner*—David Nelms
*Assistant Examiner*—David Vu
(74) *Attorney, Agent, or Firm*—Mikio Ishimaru

(57) ABSTRACT

A method for manufacturing an integrated circuit structure is provided having a semiconductor substrate and depositing a layer to be patterned on the semiconductor substrate. An organic anti-reflection coating is deposited on the layer to be patterned and then an organic photoresist on the anti-reflection coating. The photoresist is patterned and developed to form an opening having side walls and to expose a portion of the anti-reflection coating. The photoresist and the exposed portion of the anti-reflection coating adsorb non-active molecules. A unidirectional electron-ion bombardment causes desorption of non-active molecules that gives access of active molecules to the exposed surface of the anti-reflection coating. Bombardment also causes decomposition of non-active molecules on the exposed surfaces, which produces active atoms. Both processes provide unidirectional removal of the anti-reflection coating without attacking the photoresist side walls and underlying layers.

19 Claims, 1 Drawing Sheet

REMOVAL OF ORGANIC ANTI-REFLECTION COATINGS IN INTEGRATED CIRCUITS

TECHNICAL FIELD

The present invention generally relates to deep ultraviolet (DUV) photo-lithography processing, and more particularly to a method of removal of organic anti-reflection coatings formed over semiconductor substrates beneath DUV photoresist layers.

BACKGROUND ART

Photolithography is a common term which describes a process of surface mask creation above a semiconductor substrate for patterning of underlying layers such as the bulk semiconductor substrate and different dielectric, metal or polycrystalline semiconductor films or for implanting of special impurities into certain regions of the semiconductor substrate.

Basically, organic films containing photo-sensitive compounds are used as a mask pattern. Under light exposure, these compounds change their characteristics and allow removal of exposed portions of the organic photoresist by special solvents (as in case of so-called positive type photoresist) which do not attack unexposed or masked portions of the photoresist.

Thus, the residual organic photoresist materials are removed before etching of the underlying layers is performed. There was a number of problems at this time caused by general physical features of the organic materials. One of the problems was caused by the requirement of heating the silicon substrate during developing of the photoresist, which resulted in the bottom portions of the organic materials being baked differently from the top layer. At the same time, due to overexposure limitations of the organic photoresists, residual organic resist material, or photoresist footing, was left at the base of the photoresist mask after developing. The photoresist footing resulted critical dimensions (CDs) being smaller than desired according to the photoresist mask. Thus, feature size, photoresist type, baking conditions, underlying film features, etc. had to be taken into account in developing the photoresist.

At this time, plasma processing came into use to remove the organic photoresist. First, only pure oxygen plasma was used and it was created in bulk quartz reactors. Later, when dry etch of semiconductor materials appeared, the pure oxygen plasma began to be used in situ in parallel plate reactors.

However, the CD of integrated circuits are becoming smaller and smaller. To provide necessary resolution in order to meet the requirements of sub-half-micron design rules, deep ultraviolet (DUV) light with wave lengths less than 300 nm came into use for the smallest CD integrated circuits. This in turn required photoresists opaque to DUV illumination. However, most photoresists are transparent to DUV illumination. This transparency caused overexposure of bottom layers of DUV photoresists by light reflected from the substrate surface and led to loss of line width control due to more extensive removal of the overexposed photoresist.

To suppress overexposure, special anti-reflection coatings (ARC) came into use to be applied under photoresists to allow more accurate patterning. These ARC films reduced reflection drastically and made sub-half-micron size features reproducible.

There are several types of ARC that were used in integrated circuit fabrication. They include: organic ARCs, titanium nitride films, and multi-layer silicon oxi-nitride films.

The most flexible of the ARCs are organic ARCs that can be applied to the masking of microelectronic materials such as silicon, dielectrics, and metals. Most materials used in microelectronics cause organic photoresist poisoning, namely depleting or enriching proton concentration in the pre-surface layers of DUV photoresists. Since organic ARCs are chemically similar to photoresists, they do not cause poisoning of DUV photoresists and have come into common use.

One more advantage of organic ARCs is that they can be easily incorporated into the photolithographic process. In general, organic ARCs are applied to the wafer surface by a spin-deposition process before photoresist coating. Because of the simplicity of spin-deposition, the equipment for spinning-on organic ARC can be easily installed in the photolithographic equipment.

However, the organic ARC must be removed using the photoresist mask before the underlying silicon, dielectrics, or metals could be processed or etched and this is a major problem because organic ARCs are resistant to photoresist developers and remain untouched after photoresist developing.

Further, due to the thickness of the organic ARCs, there have been various problems associated with their removal without substantially changing the profiles of the openings in the photoresist masks.

Originally, plasma discharge in pure oxygen or oxygen diluted with a noble gas were used in "descum" processes to remove photoresist traces prior to wet oxide etch. These descum processes could be performed either ex-situ, outside the etching equipment or in-situ, within the equipment. Ex-situ descum processes have two main disadvantages from a manufacturing point of view even where the processes are otherwise excellent. First, the additional operations required reduce throughput of manufacturing line and second, yield is reduced because of defects added during loading and unloading the wafers. Therefore, in-situ descum processes are preferred.

In both descum processes, it was found that pure oxygen plasma is very agressive against organic materials and has great efficiency with respect to interaction with organic material, but since the etching process is based on producing active atomic oxygen, it is impossible to obtain a true anisotropic, unidirectional, etch. The atomic oxygen attacked the side walls of photoresist pattern and led to loss in line width control and uniformity. The processes were very sensitive to pattern density as well.

When organic ARCs came to be used, the above plasma processes were first used in the removal of the organic ARCs and the same problems occurred as when using the processes for descum.

The next steps in the development of organic ARC removal processes applied fluorocarbon compounds, classified as freons. Simple freons were used such as hexafluorethane (Freon-216), or tetrafluoromethane (Freon-14), or trifluoromethane (Freon-23). These freons gases were also used with oxygen. Contrary to pure oxygen plasma, these types of plasma discharge give better uniformity and, as a result, better line width control. But these methods have some disadvantages because, under radio frequency (RF) glow discharge conditions, molecules of Freon-14 and oxygen dissociate as below:

$$CF_4 + e \rightarrow CF_3^{(+)*} + F^* + (2)e \qquad (1)$$

$$O_2 + e \rightarrow O^{(+)*} + O^* + (2)e \qquad (2)$$

where the asterisks represent excited neutral atoms and radicals.

It is known that excited atomic fluorine and atomic excited oxygen are very agressive etchants against organic materials, and when they are produced in a volume of plasma and delivered to the substrate surface, they provide high velocity isotropic chemical reaction even without any additional energy applied to the surface.

These reactions provide mask profiles with the problematic ARC footing, or residual ARC material, at the bottom of the developed windows of ARCs. This created the same problems as mask footing. Furthermore, when the ARC was cleared from the underlying film, it was exposed to attack of the fluorine containing plasma. This was a major problem since silicon based materials are widely used in semiconductor manufacturing which are undesirably etched by fluorine containing plasmas during the extra-etching applied to remove the ARC footing.

To overcome loss in line width control and to prevent polymerization on pattern side walls, processes without oxygen utilizing helium plasma, nitrogen plasma, or glow discharge in their mixture were developed. These processes were free from polymerization and, contrary to fluorocarbon compound based plasmas, they did not produce any shelter effect and even provided a kind of taper profile of the photoresist pattern. They could keep CD control but a major problem was lack of productivity.

Etch rates obtained in these processes were an order of magnitude lower than processes based on the chemical reaction between oxygen or fluorine with organic materials because these processes relied only on ion bombardment for their effect. Distribution of ions by energy in glow discharge was such that most of the ions have insufficient energy to provide sputtering. Thus, only very small number of ions contribute to the efficiency of the process.

Other organic ARC removal processes used glow discharge in single gas, such as carbon monoxide, carbon dioxide, lower nitrogen oxide, nitrogen monoxide, or discharge in the mixture of these gases with nitrogen or noble gas such as helium, argon and neon.

It has been observed that carbon dioxide gas, and especially carbon monoxide based gas mixtures, in commonly used dipole ring magnet (DRM) reactive ion etching (RIE) systems lead to polymerization instead of etching where there was a buildup of material on the photoresist and the organic ARC materials, which result in subsequent loss of CD control.

In addition, with all these processes, because of the selectivity of the process on organic materials, ARC footing occurs and detrimentally shrinks the dimensions of the openings and leads to expansion of the dark field features of integrated circuits.

Solutions to these problems have been long sought, but have long eluded those having skill in the art.

DISCLOSURE OF THE INVENTION

The present invention provides a method for manufacturing an integrated circuit structure by providing a semiconductor substrate and depositing a layer to be patterned on the semiconductor substrate. An organic anti-reflection coating is deposited on the layer, to be etched, and then an organic photoresist is deposited on the organic anti-reflection coating. The organic photoresist is patterned and developed to form an opening having side walls and to expose a portion of the organic anti-reflection coating. The organic photoresist and the exposed portion of the organic anti-reflection coating adsorb neutral molecules. A unidirectional dissociating process is used to dissociate the neutral molecules on the exposed to electron-ion bombardment portions of the organic anti-reflection coating leaving the side walls of the organic photoresist unaffected and causing complete removal of the exposed organic anti-reflection coating. This allows patterning the layer to be etched using the organic photoresist as a precise mask without critical dimension narrowing due to photoresist footings.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
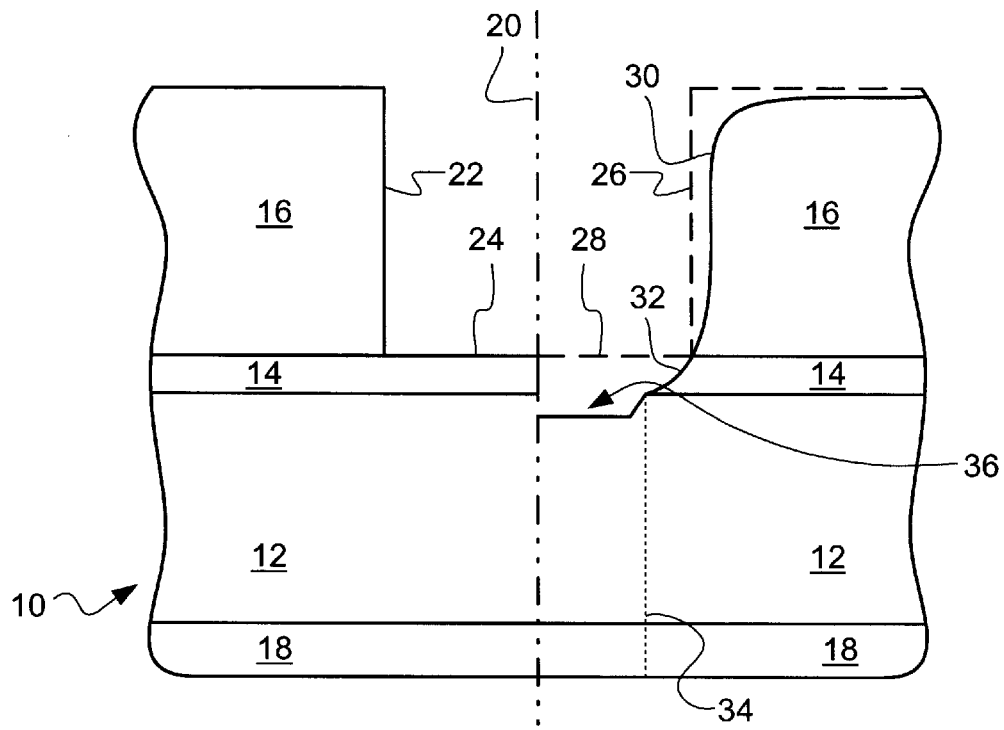
FIG. 1 (PRIOR ART) is a close-up cross-section of a portion of a semiconductor wafer with a dielectric material deposited over a semiconductor substrate.

FIG. 1 (PRIOR ART) represents a close-up cross-section of a portion of a semiconductor wafer 10 having a dielectric layer 12 deposited over a silicon semiconductor substrate 18. The dielectric layer 12 is of a material such as silicon dioxide ($SiO_2$). A spin-deposition process is used to deposit an organic anti-reflection coating (ARC) 14 on top of the dielectric layer 12. The organic ARC 14 is of a material such as polyorthoaminophenol organic polymer material by way of example, but not by way of limitation.

A deep ultraviolet (DUV) organic photoresist 16 is on top of the organic ARC 14. The organic photoresist 16 may be any type of organic photoresist, including by way of example, but not by way of limitation, chemically-amplified resists, nonchemically-amplified resists, positive-type resists, and negative-type resists. In the best mode, the organic photoresist is activated by DUV energy.

In FIG. 1 (PRIOR ART), a phantom line 20 divides the close-up cross-section of the portion of the semiconductor wafer 10 into a before and after views on the left and right, respectively.

On the left side, a processing step is shown which is after development of the organic photoresist 16 to form a side wall 22 of an opening in the organic photoresist 16 and which exposes a top surface 24 of the organic ARC 14.

On the right side there is the organic photoresist 16 and the organic ARC 14 after a conventional ARC removal step which removes a portion 26 of the organic photoresist 16 and a portion 28 of the organic ARC 14. After the removal step the organic photoresist 16 has a profile 30 and the organic ARC 14 has a footing 32. Also an etched region 36 in the dielectric layer 12 which has been determentally attacked and removed during the over etch of the organic ARC 14 is shown.

A line 34 designates the location of the surface which will be etched in the dielectric layer 12 using the conventional processes previously described in the Background Art.

Figure 2:
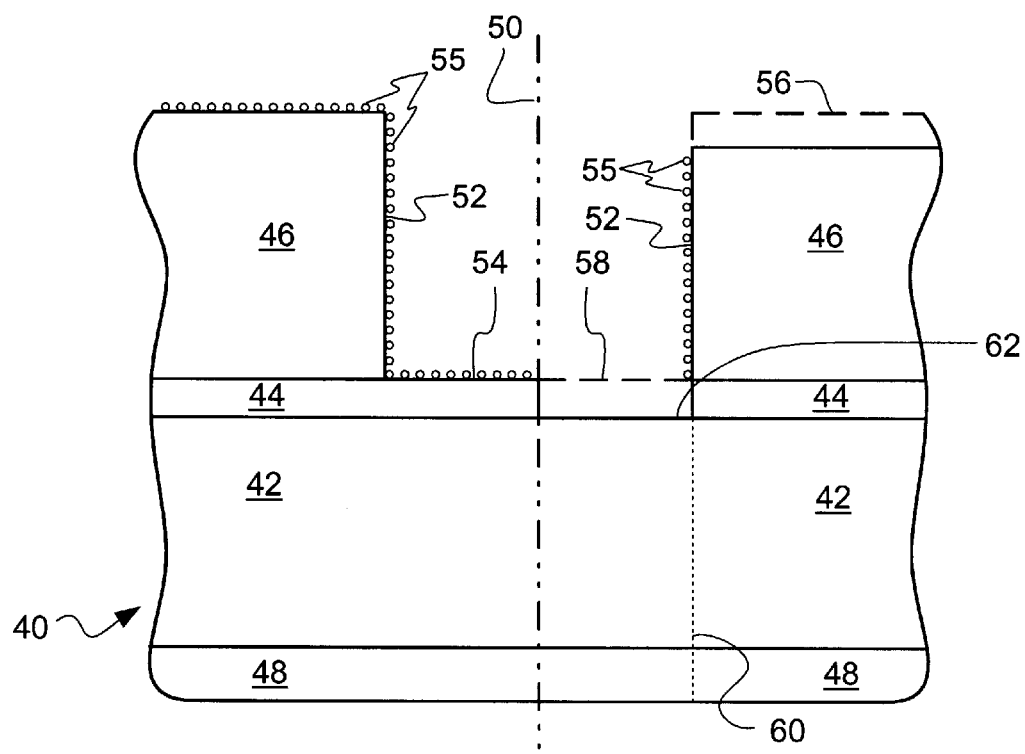
FIG. 2 shows a close-up partial cross-section of a semiconductor wafer manufactured in accordance with the present invention

FIG. 2 represents a close-up partial cross-section of a semiconductor wafer 40 manufactured in accordance with the present invention. A dielectric layer 42 has an organic ARC 44 deposited thereon. An organic photoresist 46 is deposited on the organic ARC 44.

In FIG. 2, a phantom line 50 divides the close-up cross-section of the portion of the semiconductor wafer 10 into a before and after views on the left and right, respectively.

On the left side, a processing step is shown which is after development of the organic photoresist 46 to form a side wall 52 of an opening in the organic photoresist 46 and which exposes an exposed portion 54 of the organic ARC 44. Neutral molecules 55 are adsorbed on the side wall 52 of the organic photoresist 46 and the exposed portion 54 of the organic ARC. The neutral molecules 55 are of gases such as CO or $CO_2$.

On the right side of the phantom line 50 one can see a processing step after the application of the method of the present invention in which a portion 56 of the organic photoresist 46 and a portion 58 of the organic ARC 44 are removed. The side wall 52 is vertical and adsorbed neutral molecules 55, such as $CO_2$ and CO, are shown remaining at the side wall 52, because there is no attack by electron-ion bombardment. Electron-ion bombardment has occurred to the neutral molecules 55 adsorbed on the top surface of the organic photoresist 46 and caused removal of the portion 56 of the organic photoresist 46. Similarly, the electron-ion bombardment has caused the removal of the portion 58 of the organic ARC 44 to expose a surface of the dielectric layer 42 designated as a dielectric surface 62. The organic ARC 44 has no footing, as indicated by the portion 58 of the organic ARC 44, which is in-line with the side wall 52. The surface of the dielectric surface 62 shows no parasitic etching such as shown by the etched region 36 of FIG. 1 (PRIOR ART).

A line 60 designates the location of the surface, which will be etched in the dielectric layer 42.

In the present invention, after patterning and developing the organic photoresist 46, the organic photoresist 46 and the exposed portion of the organic ARC 44 are subjected to a radio frequency (RF) glow discharge generated in a mixture of oxygen ($O_2$) and carbon monoxide (CO). This gas mixture can be diluted by certain amount of noble gas, such as helium (He), neon (Ne), argon (Ar), or a combination thereof. Under the conditions of RF glow discharge, reactions of dissociation and recombination occur:

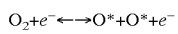  Reaction 1

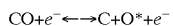  Reaction 2

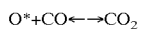  Reaction 3

All the reactions are bi-directional and the ratio between direct and reverse reactions depends upon the ratio between the gases in the gas mixture. For example, increasing of the CO content reduces the reverse compound of Reaction 3. This means that effective concentration of atomic oxygen in the gas mixture is reduced. Thus, it is possible to control the amount of neutral molecules, such as CO and $CO_2$, that do not attack the organic material. As the concentration of CO and $CO_2$ molecules sufficiently exceeds the concentration of atomic oxygen, mostly those molecules are adsorbed on top surface of the organic photoresist 46, the side wall 52, and the exposed portion 54 of the organic ARC 44. Adsorbed CO and $CO_2$ molecules cover exposed surfaces and prevent atomic oxygen from accessing the organic materials of the organic photoresist 46 and the organic ARC 44.

However, under glow discharge conditions, particle bombardment by electrons and ions takes place. Unlike neutral particles, electrons and ions follow the electric field direction of the RF glow discharge equipment (not shown). Because of this, electrons and ions unidirectionally bombard the wafer surface only in a normal direction. Thus, the side wall 52 is not exposed to electron-ion bombardment. On other hand, the top surface of the organic photoresist 46 and the exposed portion 54 of the organic ARC 44 are exposed to low energy electron and ion bombardment that activates the desorption of CO molecules and the decomposition of $CO_2$. Desorption of neutral molecules opens access for atomic oxygen, and decomposition creates oxygen directly per the reverse part of Reaction 3. All the mentioned processes are in dynamic equilibrium. Excessive oxygen content in the plasma will lead to loss of dimension control because of lateral attack to the side wall 52. Insufficient oxygen content in gas mixture causes parasitic polymerization instead of etching. When the optimal ratio between oxygen and carbon monoxide is maintained, there is no loss in dimension is observed and there is no attack on the underlying layer.

The organic ARC removal may be performed in a magnetically enhanced reactive ion etching system, more particularly in a system with dipole magnet ring and a 13.56 MHz RF generator with the following operating parameters, which are presented by way of example and not by way of limitation:

| Gas mixture | Acceptable | Preferred |
|---|---|---|
| Gas mixture | $O_2$ + CO + noble gas | $O_2$ + CO + Ar |
| Process pressure | 20–60 mTorr | 30–35 mTorr |
| RF power density | 1.0–3.5 Watts/cm$^2$ | 2.7–3.2 Watts/cm$^2$ |
| Carbon monoxide/Oxygen ratio | 1.5–5.0 | 2.0–3.5 |
| Noble Gas - Ar/(CO + $O_2$) ratio | 0.0–5.0 | 1.0–3.0 |

It should be further noted that the process of the present invention is residue free and provides favorable selectivity for etching the organic ARC 44 over most materials conventionally used in integrated circuit structures, such as silicon, dielectrics, and metals.

The present invention could be applied either in-situ or ex-situ process and could be used in micro electromechanical systems (MEMS) fabrication as well as semiconductor manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A method for manufacturing an integrated circuit structure comprising:
   providing a semiconductor substrate;
   depositing a layer to be patterned on the semiconductor substrate;
   depositing an organic anti-reflection coating on the layer to be patterned;
   depositing an organic photoresist on the organic anti-reflection coating;
   patterning and developing the organic photoresist to form an opening having a side wall and to expose a portion of the organic anti-reflection coating;
   exposing the patterned organic photoresist and the organic anti-reflection coating to radio frequency glow discharge maintained in a gas mixture;
   adsorbing neutral molecules produced in the radio frequency glow discharge by the organic photoresist and the exposed portion of the organic anti-reflection coating;
   desorbing of the neutral molecules by unidirectional particle bombardment on the exposed portion of the organic anti-reflection coating and from the organic photoresist giving access to oxygen while leaving the side wall unaffected;

unidirectional decomposition of neutral molecules producing free oxygen atoms on the surface of the organic photoresist and the organic anti-reflection coating exposed to the electron-ion bombardment;

removing the exposed portion of the organic anti-reflection coating; and patterning the layer to be etched using the organic photoresist with the organic anti-reflection coating remaining under the organic photoresist as a mask.

2. The method for manufacturing an integrated circuit structure as claimed in claim 1 including:

producing the neutral in respect of organic materials molecules during the adsorbing of the neutral in respect of organic materials molecules in radio frequency glow discharge.

3. The method for manufacturing an integrated circuit structure as claimed in claim 1 including:

producing the neutral molecules in a gas mixture.

4. The method for manufacturing an integrated circuit structure as claimed in claim 1 wherein:

desorbing of the neutral in respect of organic materials molecules uses electron-ion bombardment giving access of active particles to the surface of the organic materials.

5. The method for manufacturing an integrated circuit structure as claimed in claim 1 wherein:

unidirectional decomposition of the neutral in respect of organic materials molecules produces an active atomic element which reacts with the organic photoresist and the organic anti-reflection coating and not with the layer to be patterned.

6. The method for manufacturing an integrated circuit structure as claimed in claim 1 wherein:

removing the exposed portion of the organic anti-reflection coating uses an active atomic element.

7. The method for manufacturing an integrated circuit structure as claimed in claim 1 wherein:

removing the exposed portion of the organic anti-reflection coating is performed at a process pressure of 10 to 200 mTorr.

8. The method for manufacturing an integrated circuit structure as claimed in claim 1 wherein:

removing the exposed portion of the organic anti-reflection coating is performed in a reactive ion etching system using a radio frequency power density in the range from 0.1 Watts/cm$^2$ to 3.5 Watts/cm$^2$.

9. The method for manufacturing an integrated circuit structure as claimed in claim 1 wherein:

removing the exposed portion of the organic anti-reflection coating uses a gas and an active atomic element in a ratio from 1.5/1.0 to 5.0/1.0.

10. The method for manufacturing an integrated circuit structure as claimed in claim 1 wherein:

removing the exposed portion of the organic anti-reflection coating uses a ratio of noble gas against a sum of the remaining gasses in the mixture in a range from 0.0 to 5.0.

11. A method for manufacturing an integrated circuit structure comprising:

providing a semiconductor substrate;

depositing a layer to be patterned on the semiconductor substrate;

depositing an organic anti-reflection coating on the layer to be patterned;

depositing an organic photoresist on the organic anti-reflection coating;

patterning and developing the organic photoresist to form an opening having a side wall and to expose a portion of the organic anti-reflection coating;

exposing the patterned organic photoresist and the organic anti-reflection coating to radio frequency glow discharge maintained in a gas mixture;

adsorbing neutral molecules by the organic photoresist and the exposed portion of the organic anti-reflection coating, the neutral molecules produced in a glow discharge during the adsorbing by the organic photoresist and the organic anti-reflection coating;

desorbing of the neutral molecules by unidirectional electron-ion bombardment on the exposed portion of the organic anti-reflection coating and on the organic photoresist while leaving the side wall unaffected;

unidirectional decomposition of neutral molecules producing free oxygen atoms on the surface of the organic photoresist and the organic anti-reflection coating exposed to the electron-ion bombardment;

removing the exposed portion of the organic anti-reflection coating; and patterning the layer to be etched using the organic photoresist with the organic anti-reflection coating remaining under the organic photoresist as a mask.

12. The method for manufacturing an integrated circuit structure as claimed in claim 11 including:

producing the neutral molecules of carbon monoxide and carbon dioxide by glow discharge of a gas mixture of carbon monoxide and oxygen.

13. The method for manufacturing an integrated circuit structure as claimed in claim 11 including:

producing the neutral molecules in a gas mixture containing a noble gas selected from a group consisting of helium, neon, argon, and a combination thereof.

14. The method for manufacturing an integrated circuit structure as claimed in claim 11 wherein:

unidirectional electron-ion bombarding to desorb the neutral molecules of carbon monoxide and carbon dioxide from the organic anti-reflection coating exposed and to provide access of atomic oxygen to the surface of the exposed organic anti-reflection coating.

15. The method for manufacturing an integrated circuit structure as claimed in claim 11 wherein:

unidirectional dissociation of the neutral molecules produces atomic oxygen which reacts with the organic photoresist and the organic anti-reflection coating and not with the layer to be patterned.

16. The method for manufacturing an integrated circuit structure as claimed in claim 11 wherein:

removing the exposed portion of the organic anti-reflection coating is performed in a magnetically enhanced reactive ion etching system at a process pressure of 30 to 35 mTorr.

17. The method for manufacturing an integrated circuit structure as claimed in claim 11 wherein:

removing the exposed portion of the organic anti-reflection coating is performed in a magnetically enhanced reactive ion etching system using a radio frequency power density in the range from 2.7 Watts/cm$^2$ to 3.2 Watts/cm$^2$.

18. The method for manufacturing an integrated circuit structure as claimed in claim 11 wherein:

removing the exposed portion of the organic anti-reflection coating uses carbon monoxide and active atomic oxygen in a ratio from 2.0/1.0 to 3.5/1.0.

19. The method for manufacturing an integrated circuit structure as claimed in claim 11 wherein:

removing the exposed portion of the organic anti-reflection coating uses a ratio of noble gas against a mixture of carbon dioxide and oxygen from 1.0/1.0 to 3.0/1.0.

* * * * *